United States Patent [19]
Nakasuji

[11] Patent Number: 6,114,709
[45] Date of Patent: Sep. 5, 2000

[54] ELECTRON-BEAM TRANSFER-EXPOSURE APPARATUS AND METHOD

[75] Inventor: Mamoru Nakasuji, Yokohama, Japan

[73] Assignee: Nikon Corporation, Tokyo, Japan

[21] Appl. No.: 09/069,536

[22] Filed: Apr. 29, 1998

[30] Foreign Application Priority Data

Apr. 30, 1997 [JP] Japan ................................. 9-124723

[51] Int. Cl.[7] ................................................ H01J 37/302
[52] U.S. Cl. .............................. 250/492.23; 250/492.22
[58] Field of Search ........................ 250/492.22, 492.23

[56] References Cited

U.S. PATENT DOCUMENTS

| 5,545,902 | 8/1996 | Pfeiffer et al. ...................... 250/492.23 |
| 5,747,819 | 5/1998 | Nakasuji et al. .................... 250/492.23 |
| 5,798,196 | 8/1998 | Okino .................................. 250/492.3 |

OTHER PUBLICATIONS

Hosokawa, "Systematic Elimination of Third Order Aberrations in Electron Beam Scanning System," Optik 56:21–30 (1980).

*Primary Examiner*—Jack Berman
*Attorney, Agent, or Firm*—Klarquist Sparkman Campbell Leigh & Whinston, LLP

[57] ABSTRACT

Electron-beam transfer-exposure methods and apparatus are disclosed that exhibit a small amount of mismatch between required transfer accuracy and throughput, and that appropriately adjust transfer and exposure conditions to match particular aspects of the semiconductor circuit layer to be transferred. According to the method, a pattern region on a reticle 40 is divided into a plurality of subfields. Each subfield is regarded as an exposure unit while changing the optical conditions. When exposing a pattern that has a small filling factor, the transfer is carried out by either the image-forming action of a first projection lens 42 and a second projection lens 43 only or by operating several deflectors only. When exposing a pattern that has a large filling factor, in addition to the image-forming action of the projection lenses, the transfer is carried out by operating axis-shifting deflectors and by operating electron-beam deflectors that reduce aberrations.

7 Claims, 3 Drawing Sheets

ELECTRON-BEAM TRANSFER-EXPOSURE APPARATUS AND METHOD

FIELD OF THE INVENTION

The present invention is related to methods and apparatus for using an electron beam to transfer a pattern of a reticle (mask) onto a specimen (such as a wafer). In particular, the present invention is related to transfer-exposure methods and apparatus that use an electron beam and that can form high-density microscopic patterns (e.g., for 4 GDRAMs) at a high throughput.

BACKGROUND OF THE INVENTION

Electron beam exposures have high precision but have a disadvantage of low throughput. Various technologies have been developed in order to eliminate this disadvantage. At the present, a technology referred to as "character projection" exposure has come into practical use. In a character projection exposure, a semiconductor circuit pattern is transferred using a mask on which is formed a plurality of various repeating small pattern elements ("features") (on the order of 10 $\mu$m square). However, in order to apply this character projection to an exposure of a real semiconductor integrated circuit (such as a DRAM) onto a wafer, the throughput is low (on the order of one digit).

In contrast, as a type of photolithography apparatus that imprints an integrated circuit pattern onto a semiconductor wafer, an electron beam "reduction-transfer" apparatus is known that irradiates an electron beam onto a mask defining a fixed pattern, and then reduces and transfers the image of the pattern of that irradiated region to a wafer utilizing a two-stage projection lens (for example refer to Kokai Hei 5-160012). Because the electron beam cannot collectively irradiate the entire mask region in this type of apparatus, the field of the optical system is divided into many small regions (termed "main fields" and "subfields"), and an image of each small region is transferred while the state of the electron optical system changes for each small region (for example refer to U.S. Pat. No. 5,260,151).

Further, other methods involving use of a MOL (Moving Objective Lens) or a VAL (Variable Axis Lens) are known. These methods shift the axis of the lens by means of applying a magnetic field (generated by an axis-shifting deflector) to the lens magnetic field. However, these types of full-scale reduction-transfer apparatus are still under development.

In a conventional electron-beam transfer-exposure method, the state of each pattern portion and of each layer (regarded as the same category) which will undergo pattern formation was ignored, and the fundamental conditions of the electron optical system were considered to be always the same. For example, in an electron optical system that has VAL or MOL lenses, it was assumed that the VAL or MOL would work in the same way for a contact hole layer or a layer of a pattern that has a small filling factor as for a pattern wiring layer or a layer of a pattern having a large filling factor. Furthermore, the dimensions of the main field and of the subfields were fixed without deviations for the contact hole layer or a layer of a pattern having a small filling factor as well as for the pattern wiring layer or a layer of a pattern that has a large filling factor. Even further, the dimensions of the main field and of the subfields were fixed without any deviations for layers which required high precision or for layers whose comparative precision was not as severe.

As a result, under conditions that could achieve sufficient precision for layers which required high precision (critical layers), pattern formation would occur with excessive precision (too precise) for layers whose comparative precision is not as severe, resulting in the throughput of the apparatus being reduced on the whole.

Moreover, a beam current of the electron beam sufficient for forming a contact hole layer or a layer of a pattern having a small filling factor causes a problem when used to form a pattern wiring layer or a layer of a pattern having a large filling factor. However, an exposure method suitable for both layers was not thought out (for example, distinguishing between SMD (symmetric magnetic doublet) and MOL, VAL). This also caused mismatch between the precision in each pattern portion and the throughput.

SUMMARY OF THE INVENTION

The object of the present invention is to take the above-mentioned conventional problems into consideration and provide electron beam transfer exposure apparatus and methods that exhibit a reduced amount of the above-mentioned mismatch in addition to appropriately adjusting transfer and exposure conditions to match the state of the particular pattern being exposed.

According to the electron-beam transfer-exposure method of the first embodiment of the present invention a pattern region on a reticle is divided into a plurality of main fields, and each main field is divided into a plurality of subfields. The reticle is irradiated with an electron beam utilizing a step-and-repeat or scanning action, with each subfield being regarded as an exposure unit, while changing the optical conditions. An image of the patterned electron beam that passed through the reticle is transferred onto a specimen (wafer).

To perform this electron beam transfer exposure method an exposure apparatus is used that comprises a two-stage projection lens (including a first projection lens and a second projection lens), a respective axis-shifting deflector for each lens that can shift the electron-optical axis of the respective lens, and a respective deflector group for electron-beam deflection within the respective lens. The methods and apparatus also permit selection, as required, of activation/non-activation of the above-mentioned axis-shifting deflectors. Aberrations are reduced using the deflectors for electron-beam deflection. Pattern transfers are performed by means of the image-forming action of the first projection lens and second projection lens or by means of this image-forming action together with the operation of the axis-shifting deflectors.

In this embodiment, when exposing the contact hole layer of a semiconductor device or a layer of a pattern that has a small filling factor, the transfer is carried out by means of the image-forming action of the first projection lens and second projection lens only, or by the combined use of several deflectors. When exposing the pattern wiring layer of a semiconductor or a layer of a pattern that has a large filling factor, aberrations can be reduced using a deflector for electron-beam deflection. Transfers are carried out by means of the image-forming action of the first projection lens and second projection lens or by means of this image-forming action together with the operation of the axis-shifting deflectors.

An electron-beam transfer-exposure method according to a second embodiment of the present invention is similar to the first embodiment and is characterized by carrying out the transfer by varying the dimensions of the main fields or subfields in proportion to the filling factor of the pattern or the required transfer precision.

In this second embodiment, when exposing the contact hole layer of a semiconductor device or a layer of a pattern having a small filling factor, the transfer can be carried out by making the dimensions of the main fields or subfields larger. When exposing the pattern-wiring layer or a layer of a pattern having a large filling factor, the transfer can be carried out by means of making the dimensions of the main fields or subfields smaller.

The electron-beam transfer-exposure method according to a third embodiment of the present invention is similar to the electron-beam transfer-exposure method summarized above but is characterized by carrying out the transfer by making the dimensions of the main fields and/or subfields smaller when exposing a layer having a required high precision, and making the dimensions of the main fields and/or subfields larger when exposing a layer having a comparative precision that is not as severe.

According to an electron-beam transfer-exposure method of a fourth embodiment of the present invention, a pattern region on a reticle is divided into a plurality of main fields, and each main field is divided into a plurality of subfields. The reticle is irradiated with an electron beam utilizing a step-and-repeat or scanning action with each subfield being regarded as an exposure unit while changing the optical conditions. An image of the patterned electron beam that passed through the reticle is formed onto a specimen (wafer). This electron-beam transfer-exposure method is characterized by using a two-stage projection lens (comprising first and second projection lenses), a respective axis-shifting deflector that can move the electron-optical axis of the respective projection lens, and a respective deflector group for electron-beam deflection within each lens. Shifting or non-shifting of the axis-shifting deflectors is selectively performed. Transfer of a pattern is performed by means of the image-forming action of the first projection lens and second projection lens only or by operating several deflectors when exposing a layer having a required high precision and when exposing a layer whose comparative precision is not as severe. Thus, aberrations are reduced using deflectors for electron-beam deflection. Pattern transfer is performed by means of operating the axis-shifting deflectors in addition to the image-forming action of the first projection lens and second projection lens.

In apparatus according to the present invention, it is preferable for the projection-lens system to be a symmetrical magnetic doublet (SMD) type lens. In this lens system the following characteristics are known (*Jpn. J. Appl. Phys.* Vol. 34, pp. 3746–3753, Part 1, No. 7A, July 1995). The main field can be made larger, on the order of 20 mm×1 mm, and the subfield can be made larger (to 250 $\mu$m square or 500 $\mu$m square). However, in the same article mentioned above, it is clear that the aperture half angle in this type of lens system must be a very small angle, of 1 mrad or less. Hereupon, if the aperture half angle is small, then the trajectory of the electron beam will change due to electron-electron interactions. Since the beam blur will be large as a result, a transfer cannot be carried out using a large beam current. When exposing a wiring layer with a comparatively large pattern filling factor that requires this type of large beam current, a MOL or VAL lens system that can move the lens axis using deflectors can be used.

In contrast, in a layer that has a small filling factor ($\eta$) of a pattern that can accommodate a larger half angle, the beam current I is I J.$\eta$ if the current density is denoted as J. In a contact hole layer having an $\eta$ of 0.1 or less, the beam current I will not grow so large that electron-electron interactions become a problem. Therefore, in this type of layer, it is preferable to widen the main field and then carry out a transfer using a symmetrical magnetic doublet optical system without the use of a MOL or VAL optical system.

Furthermore, because the symmetrical magnetic doublet (SMD) optical system comprises only lenses, it can be produced with high precision due to its axial symmetry. Conversely, because the deflectors are not symmetrical on the axis in a lens system configured as a MOL or VAL, the production precision is poor, thereby leading to the possibility of image distortions during use. Therefore, an SMD lens system is used for a transfer of a pattern for a layer that requires high precision and is referred to as a "critical layer." For a layer referred to as a "non-critical layer", a transfer is carried out at a high throughput using deflectors by means of obtaining a large current with a large numerical aperture. For this case there is no mismatch in the relationship between the pattern, exposure precision, and throughput.

BRIEF DESCRIPTION OF THE DRAWINGS

FIG. 2 is a top view showing a division of a field of a pattern for a semiconductor chip as used in the electron-beam transfer-exposure method related to one embodiment of the present invention.

DETAILED DESCRIPTION OF THE INVENTION

In the following, an embodiment of the invention is described with reference to the figures.

Figure 2A:
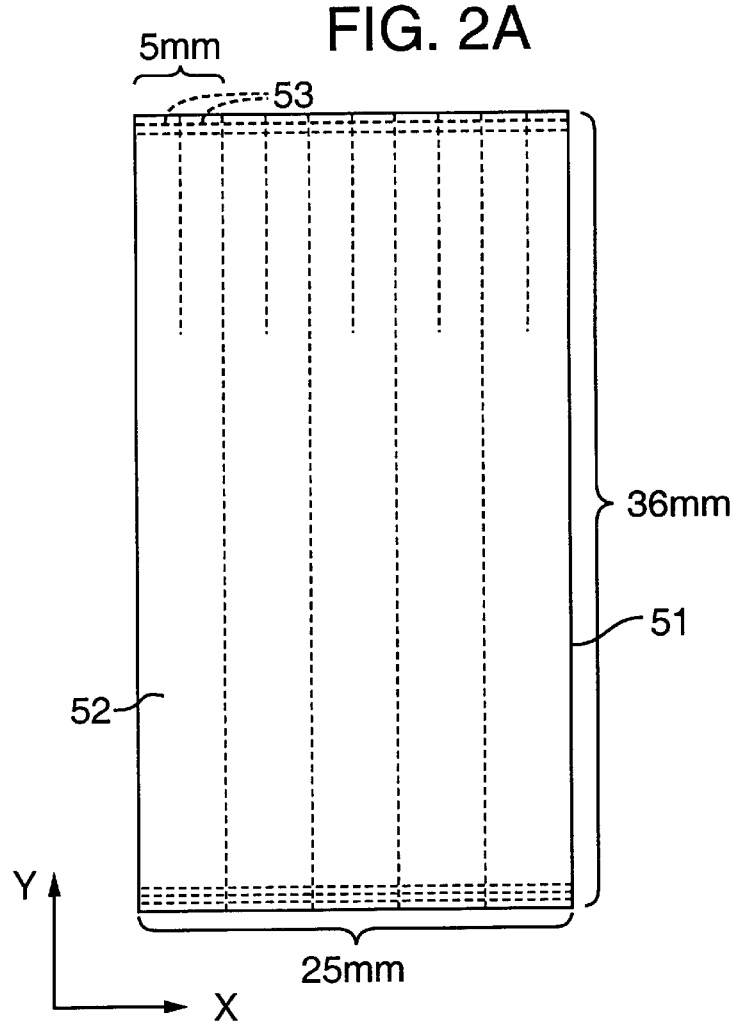
FIG. 2A shows a state in which the main field is divided on the entire chip.
Figure 2B:
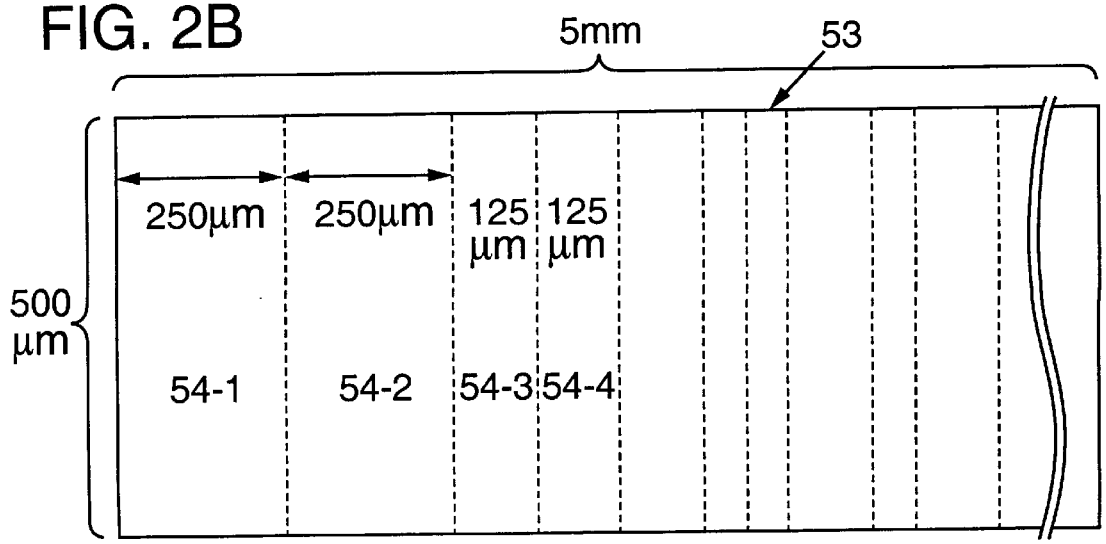
FIG. 2B shows a state in which the subfields are divided within one main field.

FIG. 2 is a top view showing field-of-view division of a semiconductor chip in the electron-beam transfer-exposure method related to one embodiment of the present invention. FIG. 2A shows a state in which the main field is divided on the entire chip, and FIG. 2B shows a state in which the subfields are divided within one main field.

For this case, the size of the chip 51 on the wafer is 25 mm wide and 36 mm long. In contrast, the pattern size of one chip on the reticle is 100 mm wide and 144 mm long if non-pattern regions are ignored and with a reduction (demagnification) ratio of ¼. In the following description, dimensions refer to sizes on the chips. Also, the lengthwise direction of FIG. 2A is the Y-direction and the widthwise direction is the X-direction.

At first, the chip 51 in this figure is divided into five stripes 52 each 5 mm wide and 36 mm long. Next, each stripe 52 is divided into main fields 53 each with a length of 500 $\mu$m in the lengthwise direction. Thus, the size of each main field is 500 $\mu$m long and 5 mm wide.

As shown in FIG. 2B, each main field is divided in the lateral direction into subfields. During this division into subfields, at first, a temporary division 250 $\mu$m wide is made. Then, the pattern-filling factor (total surface area defining pattern elements that transmit the electron beam) is calculated for each temporary subfield. (This type of operation can be handled in a CAD-CAE system.) The width of the temporary subfield having the lowest pattern density (subfields 54-1, 54-2 in FIG. 2B) follows the temporary division of 250 μm, namely, the subfield dimensions are 500 μm long and 250 μm wide.

Next, the other temporary subfields are divided again and the pattern density after the subsequent division is made to be almost identical to the above-mentioned subfield having the lowest feature density. Because of this, the number (α) of the subsequent divisions is determined for each temporary subfield. For example, α in subfields 54-3 and 54-4 in FIG. 2B is 2 and the width of each subfield is 125 μm. The data concerning α are stored in a pattern-data memory of the electron-beam reduction-transfer apparatus shown in FIG. 3.

Figure 3:
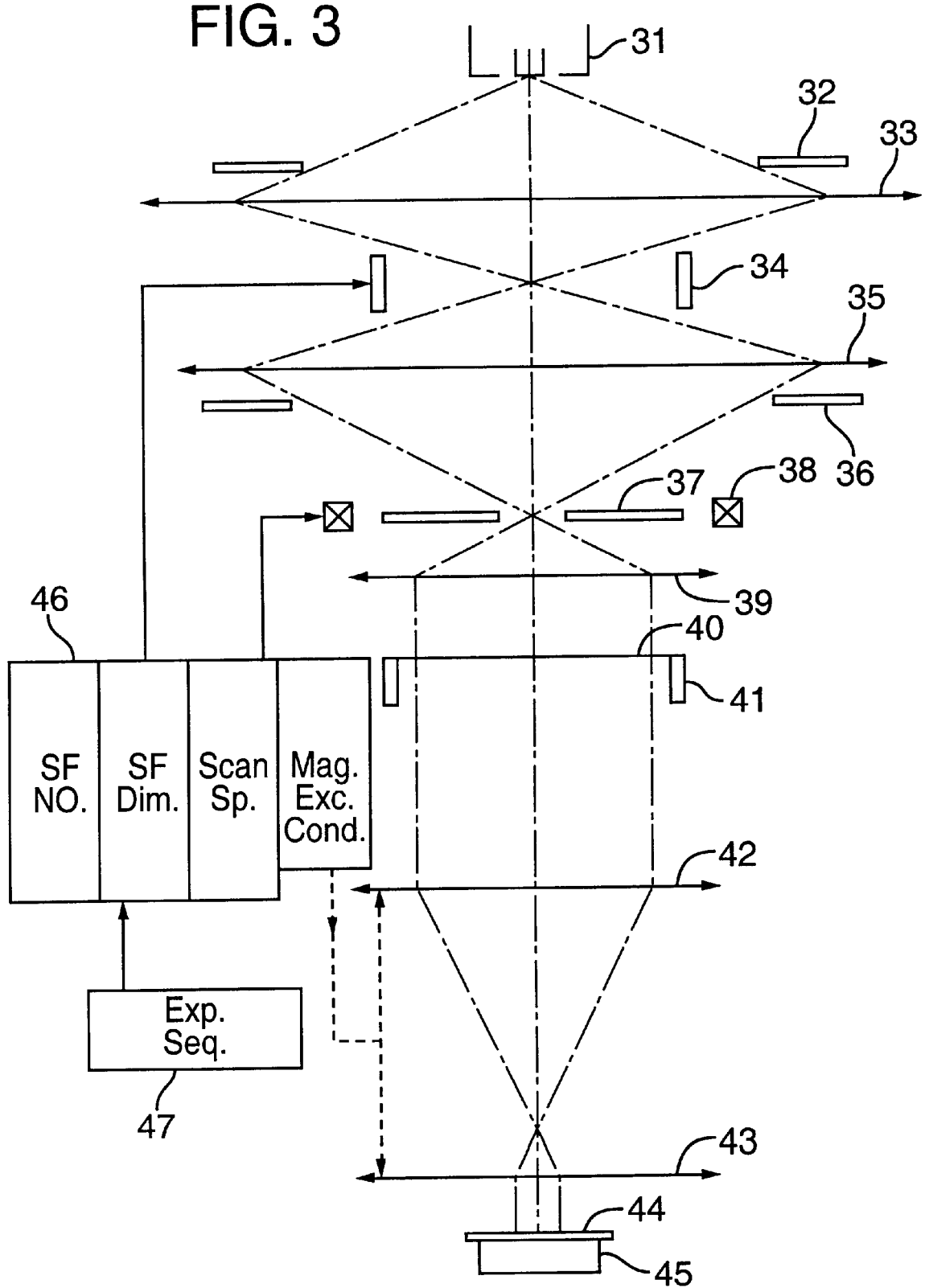
FIG. 3 shows the image-forming relationship of the optical system of an electron-beam transfer-exposure apparatus and the control relationship used in the exposure method of one embodiment of the present invention.

FIG. 3 shows the image-forming relationship of the optical system of an electron-beam transfer-exposure apparatus and the control relationship used in the exposure method of one embodiment of the present invention.

An electron gun 31 with the highest current of the optical system irradiates an electron beam in a downstream direction. A two-stage condenser lens 33, 35 is disposed beneath the electron gun 31. The electron beam (termed an "illumination beam") passes through these condenser lenses 33, 35, forming a crossover in a blanking aperture 37. The beam-current density of the illumination beam irradiating the reticle 40 can be varied by means of these two condenser lenses 33, 35 acting as a zoom lens.

A two-stage rectangular aperture 32, 36 is disposed above and beneath these condenser lenses 33, 35, respectively. The two-stage rectangular aperture 32, 36 (subfield restriction aperture) only allows a portion of the illumination beam having transverse dimensions and profile sufficient to irradiate one subfield to pass through. In concrete terms, the first aperture 32 shapes the illumination beam to a rectangular shape 510 μm long×250 μm wide at the wafer. An image of the aperture 32 is formed in the second aperture 36 by the lenses 33 and 35.

An electrostatic type deflector 34 is arranged between the first aperture 32 and the second aperture 36. By moving the image of the first aperture 32, in a direction perpendicular to the optical axis, over the second aperture 36, the deflector 34 variably shapes the illumination beam to a size of 500 μm×(250/α) μm. Hereupon, the electrostatic deflector 34 is used because it can operate faster than an electromagnetic deflector. This faster responsiveness is useful because it is necessary to change the subfield size as rapidly as 100 μsec.

A subfield-selection deflector 38 is arranged in line with the blanking aperture 37 at a position where a crossover is formed downstream of the second aperture 36. This subfield-selection deflector 38 consecutively scans the illumination beam in the X-direction of FIG. 3, and then carries out an exposure of all the subfields within one main field (5 mm wide). A condenser lens 39 is arranged beneath the subfield-selection deflector 38. The condenser lens 39 collimates the illumination beam into a parallel beam, directs the parallel beam at the reticle 40, and forms an image of the second aperture 36 on the reticle 40.

The reticle 40 in FIG. 3 only shows one subfield on the optical axis. In actuality, the subfields extend in directions perpendicular to the optical axis (in X and Y directions) and, as shown in FIG. 2, there are a plurality of subfields and main fields. When irradiating and exposing each subfield within a main field, as described above, the illumination beam is deflected by the subfield-selection deflector 38.

The reticle 40 is mounted on a reticle stage 41 movable in the XY directions of FIG. 2. A wafer 44 (substrate) is mounted on a wafer stage 45 movable in the XY directions.

By means of scanning the reticle stage 41 and wafer stage 45 in opposite Y-directions, each main field 53 within a stripe 52 of the chip 51 in FIG. 2 is exposed. By scanning both stages 41 and 45 in the X-direction, an exposure of each stripe 52 is carried out. On both stages 41 and 45, an accurate position-measurement system that uses a laser interferometer is arranged, allowing the images of each subfield and main field to be accurately stitched together on the wafer 44.

A two-stage projection lens 42 and 43 (objective lens) is disposed beneath the reticle 40. The portion of the illumination beam that corresponds to one subfield of the reticle 40 is irradiated by the illumination beam, and then the electron beam patterned by passage through the reticle 40 ("patterned beam") is reduced (demagnified) by the two-stage projection lens 42, 43, forming an image on the wafer 44. The wafer 44 is coated with a suitable resist. An electron-beam dose is applied by the patterned beam to the resist and a reduced (demagnified) image of the reticle pattern is transferred onto the wafer 44. As described above, the wafer 44 is mounted on a movable wafer stage 45 and is movable in directions perpendicular to the optical axis.

The control system of this electron-beam reduction-transfer apparatus will be described.

Data regarding the subfield number (No.), subfield dimensions, scanning speed, and lens magnetic excitation conditions for the pattern to be transferred are stored in a pattern-data memory 46. Whenever a subfield No. selection is indicated from an exposure sequencer 47 that manages the various processes of the exposure, the data concerning the dimensions of that subfield are passed to a variable deflector 34. The deflector 34 shifts the position of the image of the first aperture 32 that forms on the second aperture 36. As a result, the dimensions of the subfield as irradiated on the reticle 40 change.

Further, data on scanning speed (which is proportional to the dimensions of the subfields) are also sent to the subfield-selection deflector 38, and the exposure is carried out while successively changing the subfields. Because the product of the dimensions of the subfield and the scanning speed is fixed, the dosage amount per unit area of the pattern is maintained constant.

While constantly maintaining the subfield area within each main field and changing the main field, the in-focus conditions of each subfield are different when determining the subfield area in proportion to the average feature density of a new main field. Because of this, the magnetic excitation conditions which correspond to each subfield are sent to both projection lenses 42, 43 from the pattern-data memory 46. For this case, however, a subfield area is selected that is in proportion to the feature density in every main field, thereby making the variations in the lens magnetic excitation conditions smaller than in a conventional case. This, in turn, makes it possible to reduce the problem of degradation in beam focusing caused by inconsistency in the lens in-focus conditions.

Figure 1:
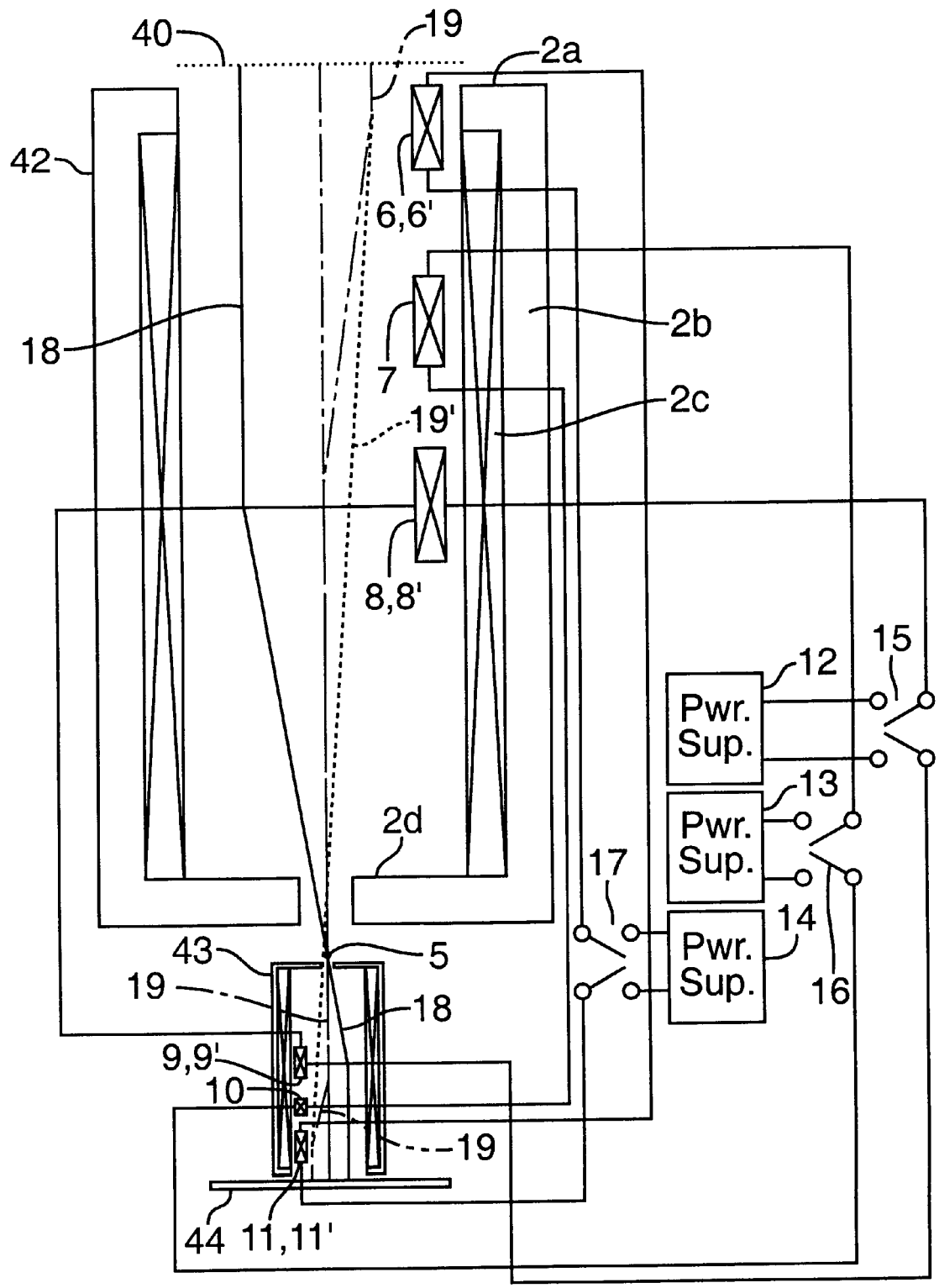
FIG. 1 is an elevational view of the projection optical system used when employing the electron-beam transfer-exposure method related to one embodiment of the present invention.

FIG. 1 is an elevational view of the projection-optical system used when employing the electron-beam transfer-exposure method related to one embodiment of the present invention.

The reticle 40 shown at the top of the figure receives electron-beam irradiation by means of the illumination-optical system shown in FIG. 3. The projection lens 42, the projection lens 43, and the wafer 44 are arranged (in this order) along the optical axis (dot-dash line in the center of the figure) beneath the reticle 40.

The projection lens 42 has a coil 2c wound around the inside periphery of a pole structure 2b having a rotationally symmetrical shape, as represented by the open-ended rectangularly shaped cross sections in the figure. An upper pole piece 2a and a lower pole piece 2d extend toward the optical axis, and a magnetic flux is formed in the direction of the optical axis between the pole pieces 2a, 2d. On the inside of the projection lens 42 a magnetic field (B(z), wherein z denotes coordinates in the direction of the optical axis) is formed. The magnetic field B(z) produced by the lens 42, beginning upstream of the lens 42 and moving downstream along the axis, increases in magnitude at the upper pole piece 2a, is uniform between the pole pieces, and decreases in magnitude at the lower pole piece 2d.

An axis-shifting deflector 6 is disposed inside the upper pole piece 2a of the lens 42. Additional axis-shifting deflectors 7 and 8 are disposed inside the lens 42 downstream of the deflector 6. The axis-shifting deflector 8 is positioned at the mid-line, in the axial direction, of the lens 42. Electron-beam deflectors 6', 8' are disposed at right angles to and at the same axial positions as the respective deflectors 6, 8 so as to overlap the respective deflectors 6, 8. The axis-shifting deflectors 6, 7, and 8 form a magnetic field Y(z) that corresponds to the first derivative dB(z) of B(z).

A crossover 5 is the point on the optical axis where the axial distance between the reticle and the wafer is divided according to the reduction (demagnification) ratio of the lenses 42, 43. The crossover 5 is also where an image of the crossover of the electron gun 31 is formed. The crossover 5 is formed directly upstream of the upper pole piece of the lens 43.

The projection lens 43 has the same shape as the lens 42 but is dimensionally smaller, according to the reduction ratio. The polarity of the lens 43 is opposite the polarity of the lens 42. Axis-shifting deflectors 9, 10, and 11 are disposed in the lens 43 in a manner similar to placement of the deflectors 8, 7, 6, respectively, in the lens 42. Electron-beam deflectors 9', 11' are disposed at right angles to, and at the same axial positions as, the respective deflectors 9, 11 so as to overlap the respective deflectors 9, 11.

A wafer (substrate) 44 is placed just downstream of the projection lens 43.

The operation of the electron beam, for a case in which the lens axis in the electron-optical system of FIG. 1 is shifted, will be described.

The electron beam ("patterned beam") that has passed through the reticle 40, irradiated by an upstream electron beam ("illumination beam"), is reduced by the two-stage projection lens 42, 43, as the projection lens 42, 43 projects and forms an image on the wafer 44. In FIG. 1, a principal ray 19, extending perpendicularly to the reticle surface from a representative point on a subfield located at a distance from the optical axis, is indicated by a dot-dot-dash line. The principal ray 19 is deflected in the direction of the optical axis by the first deflector 6', and crosses the optical axis at the mid-line of the second deflector 8'. Then, the principal ray 19 is deflected by the second deflector 8' and travels downward along the optical axis.

Hereupon, an electrical current flows through the axis-shifting deflectors 6, 7, and 8 to produce a magnetic field that shifts the axis of the lens 42. The electrical current is applied to the deflectors 6, 7, and 8 in order to make the trajectory of the principal ray 19 and the axis of the lens 42 coincident. With respect to such shifting, "r" is the distance from the optical axis to the principal ray.

The trajectory of the principal ray 19 that was made to coincide with the optical axis by means of the deflector 8' passes through the crossover 5. Then, the principal ray 19 is deflected in a direction away from the optical axis by the third deflector 9' located at a mid-line position similar to the deflector 8'. At the mid-line of the fourth deflector 11', the principal ray 19 crosses a perpendicular line extending parallel to the optical axis from a transfer position on the wafer 44. The principal ray 19 is further deflected parallel to the optical axis by the fourth deflector 11', located at a position similar to the deflector 6', so as to be incident normal to the wafer 44. In like manner to the first projection lens 42, in the second projection lens 43 as well, the electron-optical axis of the lens is shifted as required by the deflectors 9, 10, 11 to coincide with the trajectory of the principal ray 19.

Hereupon, the projection lenses 42, 43 satisfy the conditions for a symmetrical magnetic doublet (excluding one portion, described later). In other words, the first projection lens 42 and the second projection lens 43 have the following relationship when considering their positional and shape relationships to each other and to the crossover 5. The portion of the figure that includes the crossover 5 and the first projection lens 42 is dimensionally reduced, according to the reduction (demagnification) ratio (for example, ¼) to form the lens 43 without changing the position of the crossover 5. More specifically, if the portion of the figure including the lens 42 is reduced and rotated 180 degrees about the crossover 5 to the lower portion of the figure, it would exactly overlap the second projection lens 43.

Even further, in the projection-optical system of FIG. 1, if the axial distance of the reticle 40 from the crossover 5 is reduced in a like manner according to the reduction ratio, then the geometric shape and the geometric arrangement of the electron-beam deflectors 6', 8' (arranged upstream of the crossover 5) and the geometric shape and the geometric arrangement of the electron beam deflection deflectors 11', 9' (arranged downstream of the crossover 5) will be symmetrical with each other about the crossover 5. Moreover, if the axial distance of the crossover 5 from the reticle 40 is reduced in a like manner according to the reduction ratio, then the trajectory of the principal ray from the reticle 40 to the crossover 5 and the trajectory of the principal ray from the crossover 5 to the wafer 44 will be symmetrical with each other about the crossover 5.

In other words, by making the trajectory of the principal ray 19 and the geometry and placement of respective deflectors symmetrical about the crossover, aberrations caused by imperfections of the deflectors cancel each other upstream of and downstream of the crossover, thereby achieving low aberrations.

The first deflector 6' and its symmetrical counterpart (the fourth deflector 11') are controlled by the same power supply 14. The second deflector 8' and its symmetrical counterpart (the third deflector 9') are controlled by the same power supply 12. The deflectors 7 and 10, which shift the axis of the respective projection lens 42, 43, are controlled by the same power supply 13. As a result, instability of the beam due to instability of the power supplies is self-canceling, thereby making it possible to avoid loss of transfer precision caused by insufficient precision in power supply control.

Furthermore, in this embodiment, the projection lens 42 and the projection lens 43 satisfy the conditions for a symmetrical magnetic doublet in connection with their respective lens gaps, bore diameters on the reticle side and the wafer side, bore diameters on the crossover side, and magnetic excitation coils. However, the principal surface of the first lens is not necessarily at a midpoint between the reticle 40 and the crossover 5. Such a condition is not necessary in the optical system of this embodiment that includes an electron-beam deflector.

In addition, in this optical system, switches 15, 16 are provided that open and close the respective circuits between the power supplies 12, 13 and the respective deflectors. In FIG. 1, a respective power supply is connected to each coaxial set of axis-shifting deflectors and corresponding electron-beam deflectors, suggesting simultaneous activation of each respective set. However, this is just to simplify the figure; in reality, the power supplies and switches are separate elements.

For reticle patterns that require high transfer accuracy (e.g., a pattern with contact holes or a pattern that has a small filling factor), the power supplies 12, 13, and 14 (which supply power to the axis-shifting deflectors 8 and 9, 7 and 10, and 6 and 11, respectively) are disconnectable by the switches 15, 16, and 17, respectively. Further, the main field and the subfield are enlarged and the transfer carried out. Namely, the lens 42 and the lens 43 pass the principal ray emitted from the reticle 40 along the SMD trajectory 18 (solid line). Such a principal ray is incident normal to the wafer 44. Depending on the circumstances, only the axis-shifting deflectors 6, 11 and the electron-beam deflectors 6', 11' operate to achieve the same results even if the beam trajectory is as shown by the broken line 19'.

In contrast, with patterns requiring less transfer accuracy (i.e., "non-critical" patterns such as a wiring pattern or a pattern having a large filling factor), it is preferable to increase the numerical aperture and carry out the transfer with a high throughput. For this case, opposite to the above, the switches 15, 16, and 17 are closed to allow the control power supplies 12, 13, and 14 to drive respective deflectors which deflect the beam (and are situated at the respective axial positions of the respective axis-shifting deflectors 6, 7, 8, 9, 10, and 11 of the lenses 42, 43 as well as other respective deflectors situated at the same respective axial positions as the axis-shifting deflectors 6, 8, 9, and 11. Then, pattern transfer is carried out by reducing the dimensions of the main field on the order of 5 mm and the dimensions of the subfield on the order of 250 $\mu$m square. The selection of the irradiation range of the reticle 40 is performed by the method described above in connection with FIG. 3, or can be carried out by means of adjusting the zoom action of the condenser lens of the irradiation-optical system (upper half of FIG. 3).

The trajectory 19 of the principal ray when shifting the lens axis is represented as an example in FIG. 3. For example, the axis of the lens 42 is made to move to the position of this trajectory by means of the respective axis-shifting deflector 6 in opposition to the electron beam passing perpendicularly from the reticle 40. Therefore, this trajectory is not bent by the lens 42 but is bent in the direction of the optical axis (as indicated by the trajectory 19) by the deflector 6' that curves the beam and has a coil that is wound in a direction perpendicular to the coil of the axis-shifting deflector 6. Then, the deflector 8 makes this trajectory follow the path along the optical axis. Afterward, the beam is deflected diagonally downward by the deflector 9 and is then made to be incident at a right angle to the wafer 44 by the deflector 11. The axis-shifting deflectors 6, 7, 8, and 9, 10, 11 of the lenses 42, 43, respectively, operate such that the axis of the respective lens always coincides with the trajectory 19.

Next, an alternative embodiment of the present invention will be described. In the electron-beam transfer-exposure method related to this embodiment, the pattern region on the reticle is divided into a plurality of main fields, and each main field is further divided into a plurality of subfields. The reticle is irradiated with an electron beam utilizing a step-and-repeat or scanning action. Thus, the reticle is divided into "exposure units" (each exposure unit being a respective pattern region that receives reticle irradiation at a given moment). The exposure units are exposed while changing the optical conditions to form and transfer an image carried by the patterned beam onto the wafer. The pattern density ("feature density") within the exposure units is different and the size of the exposure units is varied in correspondence to the offset in feature density during an exposure of each lot or of each semiconductor chip (die) on the wafer. By means of this action, when exposing a region with a high feature density (for example, the memory region of a composite chip), the exposure units are made smaller, allowing the space-charge effect to be reduced. When exposing a region that has a feature-density offset as well, if the exposure units are made smaller, distortion and blur of the transfer image can be reduced.

As is clear from the above description, according to the present invention, it is possible to provide electron-beam transfer-exposure methods and apparatus that exhibit reduced mismatch between transfer accuracy and throughput. The methods and apparatus allow appropriate adjustment of transfer and exposure conditions according to particular characteristics of the respective semiconductor circuit pattern layers to be transferred.

The present invention is not restricted to the embodiments or figures set forth above but has a scope as defined by the claims below.

What is claimed is:

1. In an electron-beam transfer-exposure method in which a pattern defined on a reticle is divided into at least one main field of view that is further divided into multiple subfields of view; the subfields of view are irradiated with an illumination electron beam in either a step-and-repeat or scanning manner, with each subfield of view being a separate exposure unit, so as to produce a patterned electron beam from the illumination beam passing through the reticle; and directing the patterned beam through a projection-optical system to form a corresponding image on a surface of a substrate, a method for projecting the image onto the substrate, comprising:

(a) providing in the projection-exposure system first and second projection lenses configured as a two-stage projection lens, a deflector set including multiple electron-beam deflectors, and an exposure sequencer, the exposure sequencer being connected to the first and second projection lenses and to each deflector in the deflector set and being configured to select activation or non-activation of at least one deflector in the deflector set so as to selectively change exposure conditions of any of the subfields of view relative to another subfield of view of the pattern;

(b) determining a characteristic of a selected subfield of view to be projected onto the substrate;

(c) producing a patterned beam from irradiation of the selected subfield of view with the illumination beam; and (d) causing the exposure sequencer to selectively energize or not energize, corresponding to the characteristic of the selected subfield of view, at least one deflector in the deflector set as the patterned beam is being directed by the projection-optical system toward the surface of the substrate to form an image on the substrate surface.

2. The method of claim 1, wherein:

the characteristic of the selected subfield of view relates to the pattern being of a contact-hole layer for an integrated circuit or the pattern having a small fill factor; and in step (d), the signal from the exposure sequencer is appropriate to energize at least one deflector in the deflector set.

3. In an electron-beam transfer-exposure method in which a pattern defined on a reticle is divided into at least one main field of view that is further divided into multiple subfields of view; the subfields of view are irradiated with an illumination electron beam in either a step-and-repeat or scanning manner, with each subfield of view being an exposure unit, so as to produce a patterned electron beam from the illumination beam passing through the reticle; and directing the patterned beam through a projection-optical system to form a corresponding image on a surface of a substrate, a method for projecting the image onto the substrate, comprising:

(a) determining a characteristic of a selected main field of view or of a selected subfield of view to be projected onto the substrate, the characteristic pertaining to a required precision with which the selected main field of view or subfield of view, respectively, is to be projected onto the substrate; and (b) projection-transferring the selected main field of view or subfield of view, respectively, while varying at least one dimension of the main field of view or subfield of view, respectively, according to the characteristic.

4. The method of claim 3, wherein:

if the characteristic relates to the pattern being of a contact-hole layer for an integrated circuit or the pattern having a small fill factor, then, in step (b), the main field of view or subfield of view is increased in size; and if the characteristic relates to the pattern being of a wiring layer for an integrated circuit or the pattern having a large fill factor, then, in step (b), the main field of view or subfield of view is decreased in size.

5. In an electron-beam transfer-exposure method in which a pattern defined on a reticle is divided into at least one main field of view that is further divided into multiple subfields of view; the subfields of view are irradiated with an illumination electron beam in either a step-and-repeat or scanning manner, with each subfield of view being an exposure unit, so as to produce a patterned electron beam from the illumination beam passing through the reticle; and directing the patterned beam through a projection-optical system to form a corresponding image on a surface of a substrate, a method for projecting the image onto the substrate, comprising:

(a) determining a relative accuracy or precision with which a selected main field of view or a selected subfield of view is to be projected onto the substrate; and (b) projection-transferring the selected main field of view or subfield of view, respectively, while varying at least one dimension of the main field of view or subfield of view, respectively, according to the relative accuracy or precision of the selected main field of view or subfield of view, wherein the selected main field of view or subfield of view is reduced in size whenever a higher relative accuracy or precision is required, and increased in size whenever a lower relative accuracy or precision is required.

6. In an electron-beam transfer-exposure method in which a pattern defined on a reticle is divided into at least one main field of view that is further divided into multiple subfields of view; the subfields of view are irradiated with an illumination electron beam in either a step-and-repeat or scanning manner, with each subfield of view being an exposure unit, so as to produce a patterned electron beam from the illumination beam passing through the reticle; and directing the patterned beam through a projection-optical system to form a corresponding image on a surface of a substrate, a method for projecting the image onto the substrate, comprising:

(a) providing in the projection-exposure system first and second projection lenses configured as a two-stage projection lens, a deflector set including multiple electron-beam deflectors, and an exposure sequencer, the exposure sequencer being connected to the first and second projection lenses and to each deflector in the deflector set and being configured to select activation or non-activation of at least one deflector in the deflector set so as to selectively change exposure conditions of any of the subfields of view relative to another subfield of view of the pattern;

(b) determining a relative accuracy or precision with which a selected main field of view or a selected subfield of view is to be projected onto the substrate; and (c) while projection-transferring the selected main field of view or subfield of view, respectively, activating either the first and second projection lenses or at least one deflector in the deflector set whenever a higher relative accuracy or precision is required, and activating the first and second projection lenses and at least one deflector in the deflector set whenever a lower relative accuracy or precision is required.

7. In an electron-beam transfer-exposure method in which a pattern defined on a reticle is divided into at least one main field of view that is further divided into multiple subfields of view; the subfields of view are irradiated with an illumination electron beam in either a step-and-repeat or scanning manner, with each subfield of view being a separate exposure unit, so as to produce a patterned electron beam from the illumination beam passing through the reticle; and directing the patterned beam through a projection-optical system to form a corresponding image on a surface of a substrate, a method for projecting the image onto the substrate, comprising:

(a) providing in the projection-exposure system first and second projection lenses, a deflector set including a first deflector associated with the first projection lens and a second deflector associated with the second projection lens and electrically connected in series with the first deflector, and a power supply electrically connected to the first and second deflectors;

(b) determining a characteristic of a selected subfield of view to be projected onto the substrate; and (c) producing a patterned beam from irradiation of the selected subfield of view with the illumination beam.

* * * * *

UNITED STATES PATENT AND TRADEMARK OFFICE
CERTIFICATE OF CORRECTION

PATENT NO. : 6,114,709
DATED : September 5, 2000
INVENTOR(S) : Mamoru Nakatsuji

Page 1 of 1

It is certified that error appears in the above-identified patent and that said Letters Patent is hereby corrected as shown below:

Column 3,
Line 64, change "I is I J.η" to -- I is I ∝ J.η --

Column 8,
Line 55, change "lens 42, 43" to -- lenses 42, 43 --

Signed and Sealed this

Twenty-first Day of August, 2001

Attest:

*Nicholas P. Godici*

NICHOLAS P. GODICI
*Attesting Officer*  *Acting Director of the United States Patent and Trademark Office*